United States Patent
Chuang et al.

(10) Patent No.: US 9,659,953 B2
(45) Date of Patent: May 23, 2017

(54) HKMG HIGH VOLTAGE CMOS FOR EMBEDDED NON-VOLATILE MEMORY

(71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Ya-Chen Kao, Fuxing Township (TW); Yi Hsien Lu, Yuanchang Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 166 days.

(21) Appl. No.: 14/324,369

(22) Filed: Jul. 7, 2014

(65) Prior Publication Data

US 2016/0005756 A1    Jan. 7, 2016

(51) Int. Cl.

| | | |
|---|---|---|
| H01L 27/115 | (2006.01) | |
| H01L 21/8234 | (2006.01) | |
| H01L 27/092 | (2006.01) | |
| H01L 29/66 | (2006.01) | |
| H01L 29/423 | (2006.01) | |
| H01L 27/11573 | (2017.01) | |
| H01L 29/51 | (2006.01) | |
| H01L 27/088 | (2006.01) | |

(52) U.S. Cl.
CPC ......... *H01L 27/11573* (2013.01); *H01L 21/823462* (2013.01); *H01L 27/092* (2013.01); *H01L 29/42344* (2013.01); *H01L 29/66545* (2013.01); *H01L 27/088* (2013.01); *H01L 29/513* (2013.01); *H01L 29/517* (2013.01); *H01L 29/665* (2013.01); *H01L 29/6656* (2013.01)

(58) Field of Classification Search
None
See application file for complete search history.

(56) References Cited

U.S. PATENT DOCUMENTS

| 6,570,213 | B1 | 5/2003 | Wu | |
|---|---|---|---|---|
| 2008/0029805 | A1* | 2/2008 | Shimamoto | H01L 21/28282 257/315 |
| 2012/0299084 | A1* | 11/2012 | Saito | H01L 21/28282 257/324 |
| 2013/0082318 | A1* | 4/2013 | Liu | H01L 27/11546 257/324 |

(Continued)

*Primary Examiner* — Mary Wilczewski
*Assistant Examiner* — Erik T Peterson
(74) *Attorney, Agent, or Firm* — Eschweiler & Potashnik, LLC

(57) ABSTRACT

The present disclosure relates to a structure and method for embedding a non-volatile memory (NVM) in a HKMG (high-κ metal gate) integrated circuit which includes a high voltage (HV) HKMG transistor. NVM devices (e.g., flash memory) are operated at high voltages for its read and write operations and hence a HV device is necessary for integrated circuits involving non-volatile embedded memory and HKMG logic circuits. Forming a HV HKMG circuit along with the HKMG periphery circuit reduces the need for additional boundaries between the HV transistor and rest of the periphery circuit. This method further helps reduce divot issue and reduce cell size.

20 Claims, 8 Drawing Sheets

(56) References Cited

U.S. PATENT DOCUMENTS

| | | | |
|---|---|---|---|
| 2014/0225176 A1* | 8/2014 | Cheek | H01L 27/11546 257/314 |
| 2014/0374814 A1* | 12/2014 | Wu | H01L 27/11568 257/326 |
| 2015/0041875 A1* | 2/2015 | Perera | H01L 29/78 257/314 |
| 2015/0060983 A1* | 3/2015 | Lusetsky | H01L 29/66825 257/316 |
| 2015/0069524 A1* | 3/2015 | Hong | H01L 27/1203 257/392 |

* cited by examiner

HKMG HIGH VOLTAGE CMOS FOR EMBEDDED NON-VOLATILE MEMORY

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a metal gate electrode to improve device performance with the decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
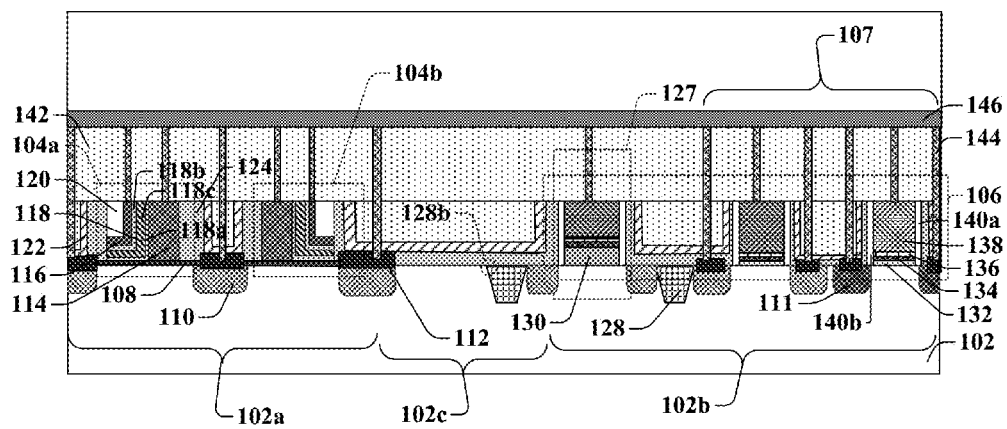
FIG. 1 illustrates a cross sectional view of an integrated circuit with an embedded NVM (non-volatile memory) and a high voltage (HV) HKMG (high-κ metal gate) transistor, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an attempt to reduce cost while still improving device performance, a direction taken by the semiconductor industry has been the integration of logic devices and memory devices on the same semiconductor chip. This integration improves performance over solutions where two separate chips—one for memory and another for logic—cause undesirable delays through wires or leads that connect the two chips. In addition, the processing costs for integrating memory and logic devices on the same semiconductor chip are reduced due to the sharing of specific process steps used to fabricate both types of devices.

High-κ metal gate (HKMG) technology has become one of the front-runners for the next generation of CMOS devices. This technology incorporates a high-κ dielectric, which reduces leakage and improves the dielectric constant. To help with fermi-level pinning and to allow the gate to be adjusted to low threshold voltages, a metal gate is used instead of a polysilicon gate. By combining the metal gate and high-κ dielectric, HKMG technology reduces gate leakage, thereby increasing the transistor capacitance and allowing chips to function with reduced power needs. Thus, integrating memory devices with HKMG logic devices is a technology that enables conventional scaling of the transistor as well as reduction in stand-by power due to a reduction in gate leakage.

Flash memory is one type of non-volatile memory that is operated at high voltages for its read and write operations, and hence a high voltage (HV) device is incorporated in integrated circuits involving non-volatile embedded memory and HKMG logic circuits. The operation power for these HV devices is normally provided by a HV gate insulating layer (usually oxide), which provides higher power and have higher breakdown voltage than conventional MOS devices. Conventional embedded memory—HKMG integrated circuits use a poly-SiON (silicon oxynitiride) HV CMOS transistor for its HV operations, along with HKMG CMOS logic processes. A problem associated with such integrated circuits, is a comparatively high STI (shallow trench isolation) loss or "divot" issue which arises due to HV oxide removal from the embedded memory region.

Accordingly, the present disclosure relates to a new processing method and structure for an integrated circuit with a HV HKMG transistor disposed between the embedded memory region and the HKMG periphery circuit. A HV gate insulating layer is formed in the periphery region of the semiconductor substrate followed by formation of the HKMG periphery circuit over the entire periphery region. The transistor formed over the HV gate insulating layer becomes the HV HKMG CMOS transistor. This eliminates the need for forming extra boundaries since the HV device and the rest of the HKMG logic circuit can be formed with the same processing steps. Also, the HV gate insulating layer is formed after formation of the NVM device, such that the NVM region on the substrate does not undergo HV oxide removal, which reduces STI loss/divot issue in the boundary region. Further, this will enable a more controlled tuning of the threshold voltages of the HV device with a metal gate (rather than a poly gate).

FIG. 1 illustrates a cross sectional view of an integrated circuit 100 with an embedded NVM and a HKMG periphery circuit, including a HV HKMG transistor, according to some embodiments of the present disclosure.

Integrated circuit 100 resides on a Si substrate 102 which has a memory region 102a and a periphery region 102b separated by a boundary region 102c. A pair of adjacent flash memory cells 104a and 104b resides on the memory region 102a and a HKMG circuit 106 resides over the periphery region 102b. The memory cells 104a and 104b reside over a base dielectric layer 108 (disposed over a base surface of the semiconductor substrate 102) and memory cell 104a is a mirror image of the memory cell 104b. Source/drain regions 110 are disposed within the substrate 102. Reference numeral 110 represent n-type source/drain implants while 111 represent p-type source/drain implants. A base silicide layer 112 resides over the semiconductor substrate above the source/drain regions 110 and 111. Each flash memory cell 104a and 104b comprises a select gate (SG) 114, a memory gate (MG) 116, a charge-trapping layer 118 which extends below the MG 116, and a side wall spacer 120 which abuts an outer sidewall of the MG 116. In some embodiments, the MG 116 can have a square or rectangle shape, rather than an 'L' shape, as illustrated in this embodiment. The charge trapping layer 118 can comprise a tunnel oxide 118a, and a blocking oxide 118b, with a charge trapping material 118c, such as a nitride layer or arrangement of sphere-like silicon nanostructures sandwiched there between.

During operation, the first and second memory cells 104a, 104b can each be thought of as two transistors in series. Within each cell, one transistor is the memory gate transistor (e.g., corresponding to MG 116), and the other is the select gate transistor (e.g. corresponding to SG 114) which is controlled by a word line. Programming is performed by means of source-side channel hot-electron injection. Poly-to-poly Fowler-Nordheim (FN) electron tunneling is employed for erasing. To change the cell value to a "0", a negative electrical potential is applied to both the MG and SG transistors, such that the electrons stored in the charge-trapping layer (e.g., 118) are drained to the source side of the memory cell (e.g., 110). The electrons in the cells of a chip can be returned to normal "1" by the application of a strong positive electric field, which causes electrons passing through the channel region of the transistors to tunnel into the charge-trapping layer 118 and thereby shift the voltage threshold of the memory cell. Because the electrons tend to remain in the charge-trapping layer even when power is disconnected from the chip, the flash memory cells are said to be "non-volatile."

A contact etch-stop layer (CESL) 122 resides over the base of the semiconductor substrate above the base silicide layer 112 as well as on the outer sidewalls of the SGs and the sidewall spacers of each memory cell 104a and 104b and the HKMG transistors. An inter-gate oxide layer 124 is disposed over the semiconductor substrate 102 in between the gates and the CESL 122.

The HKMG circuit 106 includes a high voltage (HV) HKMG transistor 127 which is isolated from the rest of the circuit by shallow trench isolation (STI) regions 128. Reference numeral 128b represents an STI corner with a reduced divot issue. Divots are unwanted openings in the insulating material at the upper corners of the shallow trench. The divots can cause a number of different problems during the later fabrication, or function, of active devices. For example, the divot can create depth of focus issues that interfere with the accurate photolithographic patterning of active device features (e.g., a transistor gate). It can be problematic to metalize device features (e.g., source and drain regions) that are located in the vicinity of divots without creating electrical shorts within the active devices. Some materials deposited to form an active device feature can inadvertently get deposited into a divot, thereby causing the device to have undesirable electrical properties. For example, polysilicon deposited as part of forming a transistor gate can get deposited into a divot, thereby causing a non-uniform electrical field to be generated in the channel region of the transistor.

In some embodiments, the HKMG circuit 106 can also include low-voltage devices 107, which can include logic, static random access memory (SRAM), or input/output cells. The HV HKMG transistor 127 resides over a thick HV gate insulating layer 130, while the rest of the low voltage devices 107 in periphery region 102b reside over a thin gate oxide layer 132. All of the HKMG transistors of the HKMG circuit 106 comprise a high-κ dielectric layer 134, which resides over the gate oxides 130 and 132, an etch-stop layer (ESL) 136 residing over the high-κ dielectric layer 134, and metal gate 138 residing over the ESL 136. Sidewall spacers 140a and 140b are disposed on either side of these layers for each of the transistors. An inter-layer dielectric (ILD) layer 142 is deposited entirely over the devices, covering their top surfaces as well as surrounding them. Metal contacts 144 extend to all the active regions on the integrated circuit 100. A protective barrier layer 146 is disposed above the metal contacts 144 and the ILD layer 142.

As will be appreciated in greater detail below, incorporating the HV HKMG transistor 127 between the embedded flash memory region 102a and the HKMG low-voltage devices 107 helps control HV operations of the NVM device with efficiency, speed and reduced boundary region/device size.

Figure 2:
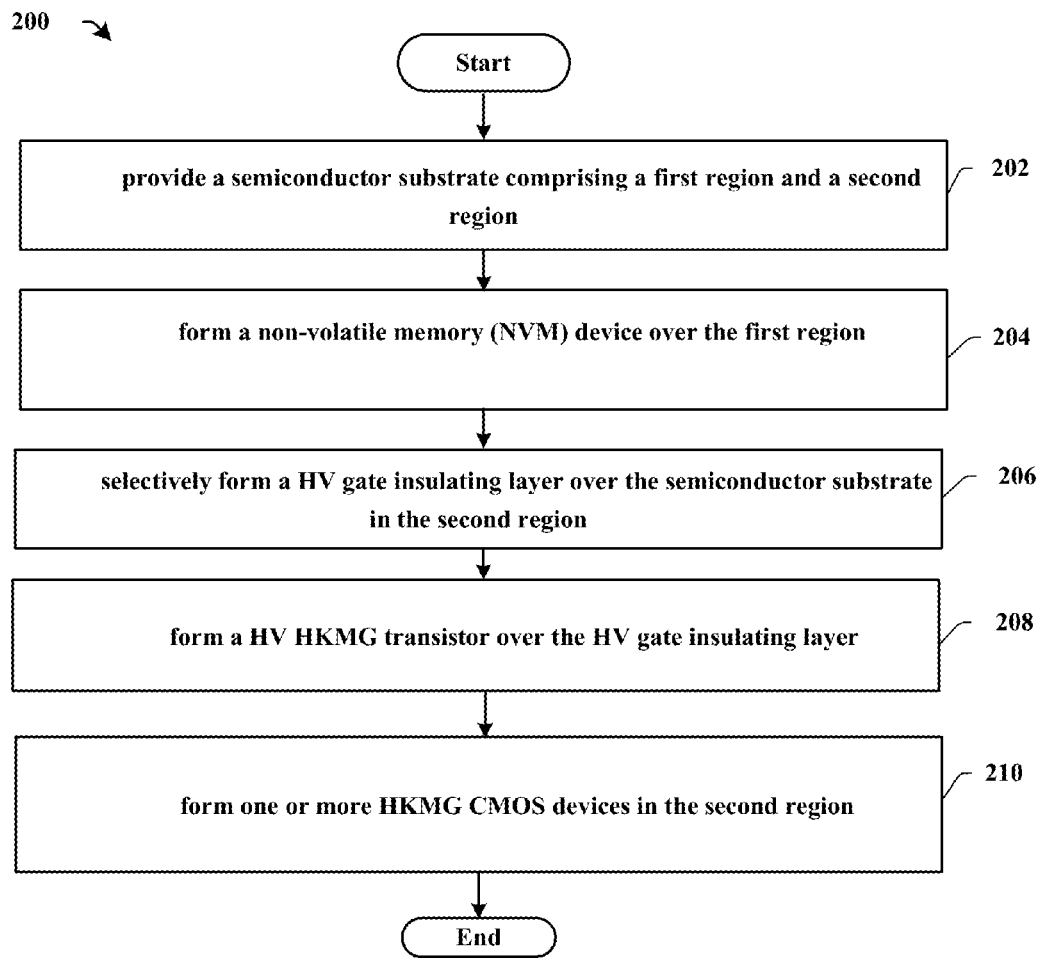
FIG. 2 illustrates a flow diagram of some embodiments of a method for forming an integrated circuit according to the present disclosure.

FIG. 2 illustrates a flow diagram of some embodiments of a method 200, for forming an integrated circuit according to the present disclosure. While disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a semiconductor substrate comprising a first region and a second region is provided.

At 204, a NVM device, such as a split gate flash memory cell for example, is formed over the first region.

At 206, a HV gate insulating layer is formed over the semiconductor substrate in the second region.

At 208, a HV HKMG transistor is formed over the HV gate insulating layer.

At 210, one or more HKMG CMOS devices are formed in the second region.

FIGS. 3-18 illustrate embodiments of cross sectional images of a step by step method for formation an integrated circuit with a HV HKMG transistor, according to the present disclosure. It will be appreciated that although these cross-sectional views illustrate only a pair of split-gate memory cells, in typical embodiments an integrated circuit will include thousands, millions, billions, or even greater numbers of such split gate memory cells arranged in a memory array. The final integrated circuit also includes peripheral circuitry that can utilize different process layers (e.g., HKMG and/or replacement metal gate technology), such as are used in CMOS processes. Integration of the split-gate memory cells and the peripheral circuitry has caused a number of integration and reliability issues, which are mitigated in the process flow set forth below.

Figure 3:
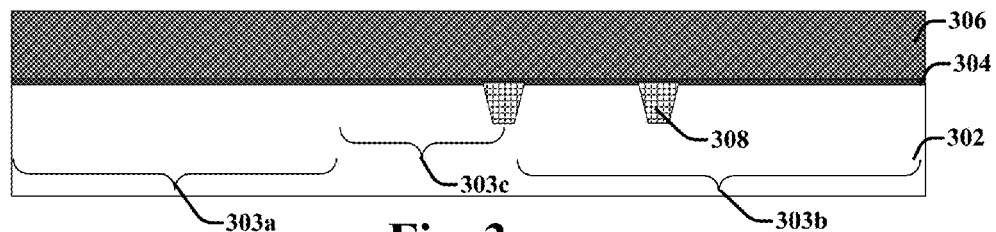
FIGS. 3-18 illustrate embodiments of cross sectional images of a step by step method of formation of an integrated circuit with a HV HKMG transistor, according to the present disclosure.

FIG. 3 illustrates a cross-sectional view of a semiconductor body 300 at one of the initial stages of forming an embedded flash memory-HKMG integrated circuit, according to some embodiments of the present disclosure. The semiconductor body 300 includes a semiconductor substrate 302 on which memory devices and peripheral devices (e.g., CMOS devices) are formed. In some embodiments, the semiconductor substrate 302 can be a bulk silicon substrate, a silicon on insulator (SOI) substrate, a binary semiconductor substrate (e.g., GaAs), tertiary semiconductor substrate (e.g., AlGaAs), or higher order semiconductor substrate, for example. Any of these substrates can include doped regions formed in the substrate, one or more insulating layers formed in or on the substrate, and/or conducting layers formed in or on the substrate. The semiconductor substrate 302 has been assigned three regions, namely a memory region 303a, a periphery region 303b and a boundary region 303c. A base dielectric layer 304 resides over a top surface of the semiconductor substrate 302. In some embodiments, the base dielectric layer 304 comprises an oxide layer, a nitride layer, SiON (silicon oxy nitride) layer, or a high-κ gate dielectric, and can help protect the semiconductor body during future etching steps. A poly silicon layer 306 is formed over the base dielectric layer 304, which will later be patterned to form gate structures for the memory cells. STI regions 308 are disposed within the substrate 302.

Figure 4:
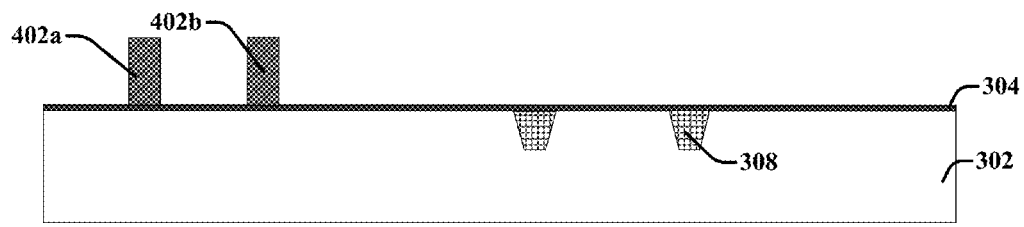

FIG. 4 illustrates a cross-sectional view of a semiconductor body 400 after patterning the poly silicon layer 306 to vertical structures 402a and 402b which will become the SGs for the split gate flash memory cells that will be formed at a later stage.

Figure 5:
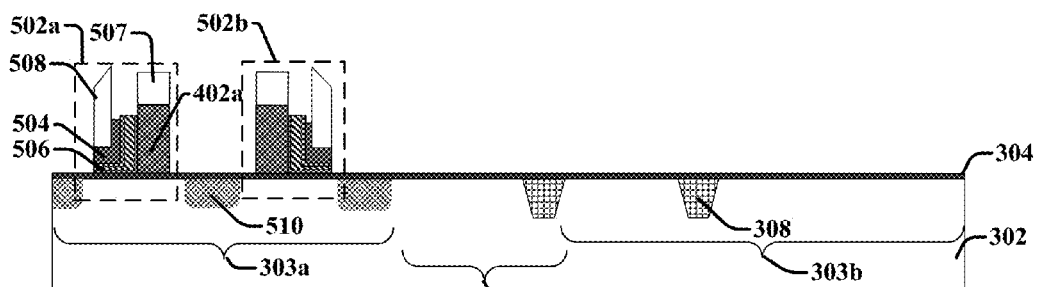

FIG. 5 illustrates a cross-sectional view of a semiconductor body 500 after forming a pair of split gate flash memory cells 502a and 502b over the memory region 303a. Each of the memory cells 502a and 502b comprises a SG 402a, a MG 504, a charge-trapping layer 506 which extends below the MG 504, a side wall spacer 508 which abuts an outer sidewall of the MG 504 and spacer material cap 507 over a top surface of the SG 402a. In some embodiments, the MG 504 can have a square or rectangle shape, rather than an 'L' shape, as illustrated in this embodiment. Further, source/drain regions 510 are formed within the semiconductor substrate 302, for example, by ion implantation or out-diffusion of dopants.

Figure 6:
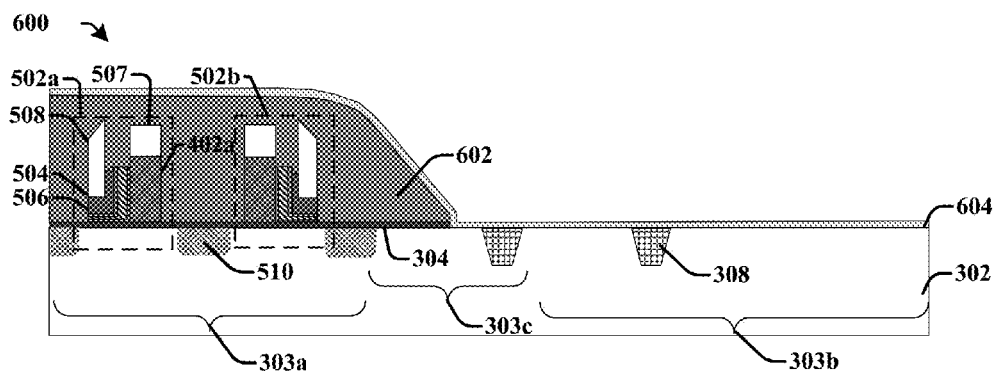

FIG. 6 illustrates a cross-sectional view of a semiconductor body 600 after removing the base dielectric layer from the periphery region 303b and part of the boundary region 303c, forming a protective sacrificial layer 602 over the memory cell region 303a, and forming a first oxide layer 604 over the protective sacrificial layer 602 and the rest of the top surface of the semiconductor substrate 302. In some embodiments, the first oxide layer 604 is formed by an ISSG (in-situ steam generation) oxide deposition and its thickness is approximately 60 Angstroms. In some embodiments, the protective sacrificial layer 602 is made of polysilicon and protects the memory cells 502a and 502 in the future etching steps. An additional etch stop layer can be present over upper surfaces and sidewalls of the split gate cells under the protective sacrificial layer 602.

Figure 7:
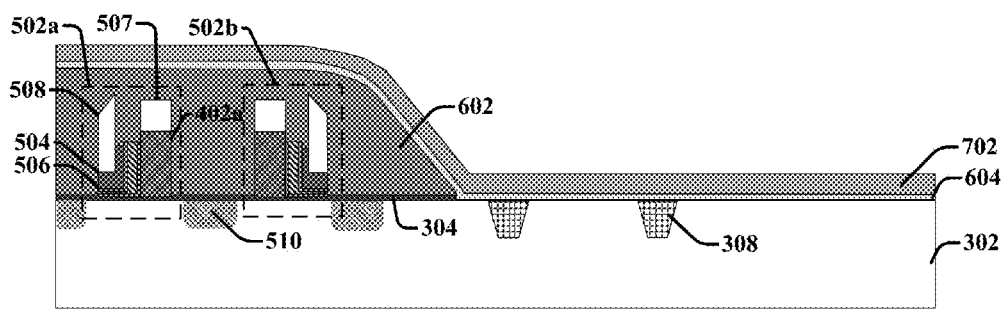

FIG. 7 illustrates a cross-sectional view of a semiconductor body 700 after depositing a high temperature oxide (HTO) layer 702 over the first oxide layer 604. In some embodiments, HTO layer 702 is formed by rapid thermal annealing (RTA) at 1000° C. for 30 seconds. The thickness of the HTO layer 702 is approximately 120 Angstroms in some embodiments.

Figure 8:
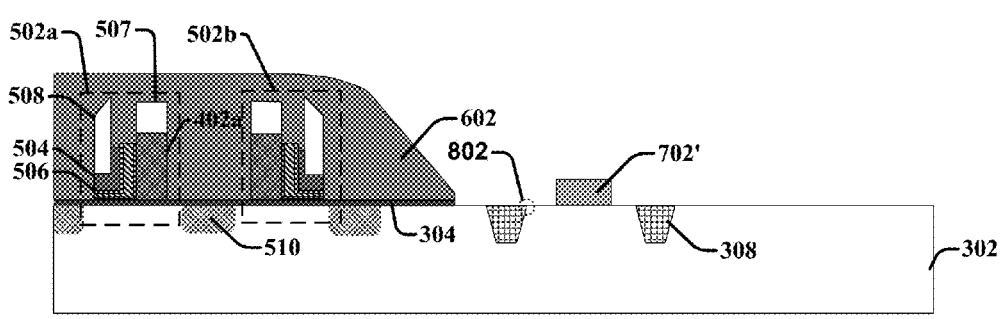

FIG. 8 illustrates a cross-sectional view of a semiconductor body 800 after selectively patterning and etching the HTO layer 702 and the first oxide layer 604 to create a HV gate insulating layer 702'. In some embodiments, a wet etching process is performed. The thickness of the HV gate insulating layer 702' is between approximately 80 angstroms and 200 angstroms, being approximately 180 Angstroms in some embodiments.

Figure 9:
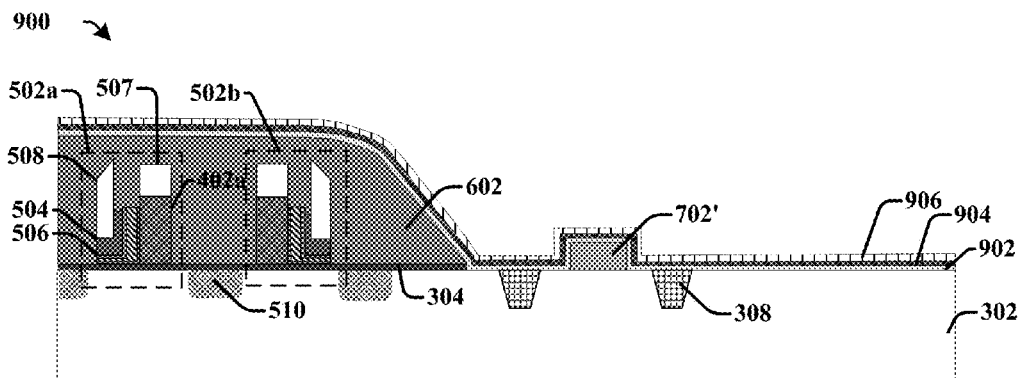

FIG. 9 illustrates a cross-sectional view of a semiconductor body 900 after depositing a gate oxide layer 902, a high-κ dielectric layer 904 and an etch-stop layer (ESL) 906 over the protective sacrificial poly layer 602, the HV gate insulating layer 702' and the rest of the top surface of the semiconductor substrate 302. In some embodiments, the gate oxide layer 902 can have a thickness that is between ½ and ¼ of the thickness of the HV gate insulating layer 702', and can for example have a thickness of less than 100 angstroms or even less than 50 angstroms. In some embodiments, the high-κ dielectric layer 904 comprises HfO (hafnium oxide), HfSiO (hafnium silicon oxide), HfAlO (hafnium aluminum oxide), or HfTaO (hafnium tantalum oxide). The ESL 906 is usually a metal layer which acts as a stopping layer during poly etching in the later stages of processing.

Figure 10:
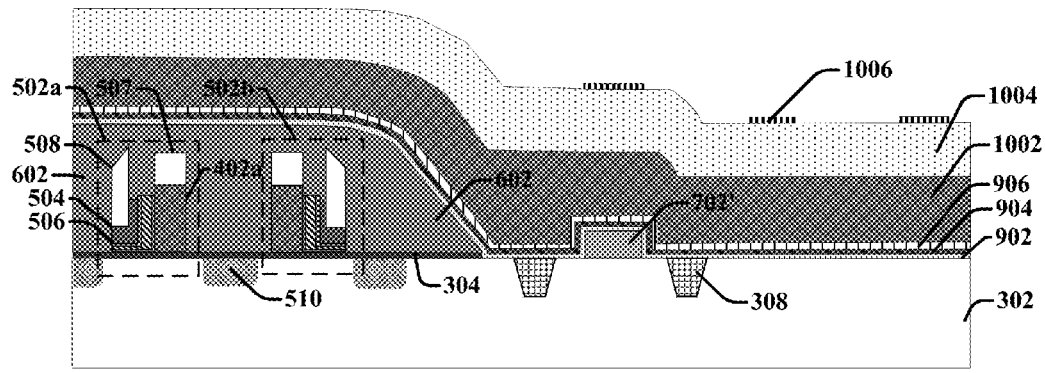

FIG. 10 illustrates a cross-sectional view of a semiconductor body 1000 after forming a sacrificial poly layer 1002 and a hard mask layer 1004 over the ESL 906. Reference numeral 1006 represents patterned masks that define the dimensions of the HKMG periphery circuit devices/transistors formed at a later stage.

Figure 11:
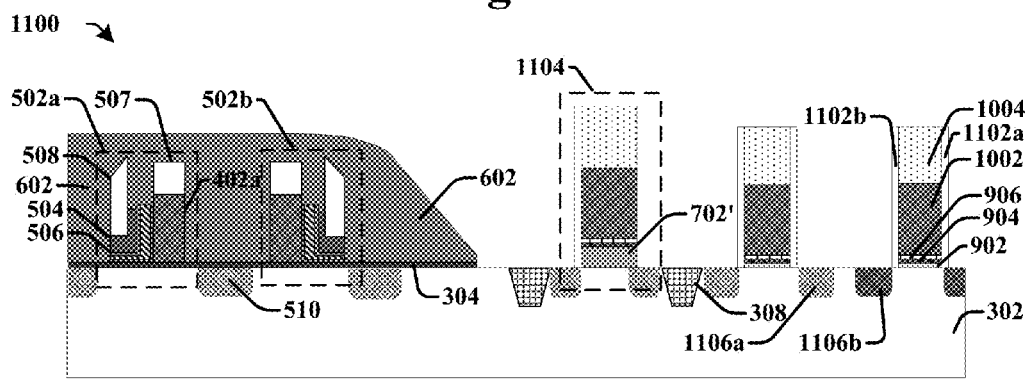

FIG. 11 illustrates a cross-sectional view of a semiconductor body 1100 after patterning all the HKMG device layers based on mask 1006 to form HKMG transistors and forming sidewall spacers 1102a and 1102b on either side of all the HKMG transistors. The transistor formed over the HV gate insulating layer 702' becomes the HV HKMG transistor 1104. Source/drain regions are also formed within the substrate 302 around all the HKMG transistors. 1106a represents n-type ion implants whereas 1106b represents p-type ion implants.

Figure 12:
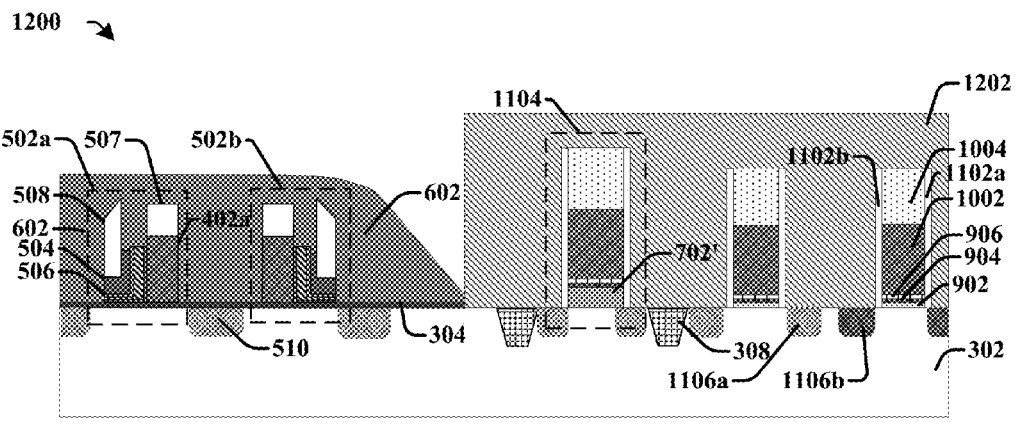

FIG. 12 illustrates a cross-sectional view of a semiconductor body 1200 after removing all the layers associated with the HKMG periphery circuit from above the protective sacrificial poly layer 602. A mask 1202 protects the HKMG circuit during this removal/etching process.

Figure 13:
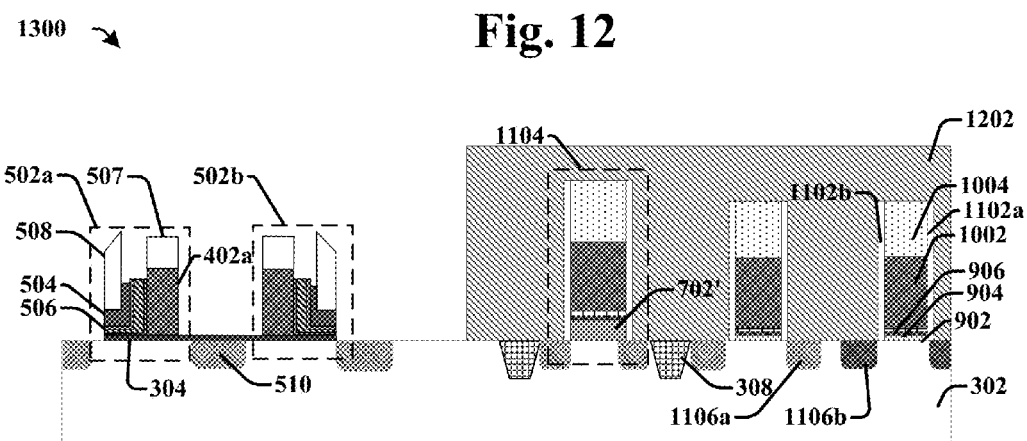

FIG. 13 illustrates a cross-sectional view of a semiconductor body 1300 after removing the protective sacrificial poly layer 602. Here again, mask 1202 protects the HKMG circuit during this etching process. Additionally, the etch can stop on an etch stop layer (not shown) over upper surfaces and sidewalls of the split-gate flash cells.

Figure 14:
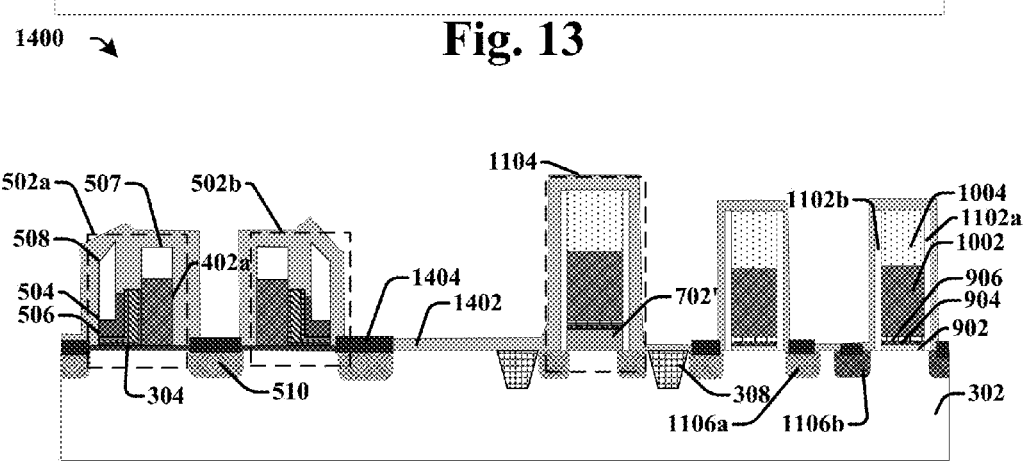

FIG. 14 illustrates a cross-sectional view of a semiconductor body 1400 after removing the mask 1202, forming an inter-gate oxide layer 1402, patterning the inter-gate oxide layer 1402 and forming a base salicide (self-aligned silicide) layer 1404 over the source/drain regions. In some embodiments, the base salicide layer 1404 comprises NiSi.

Figure 15:
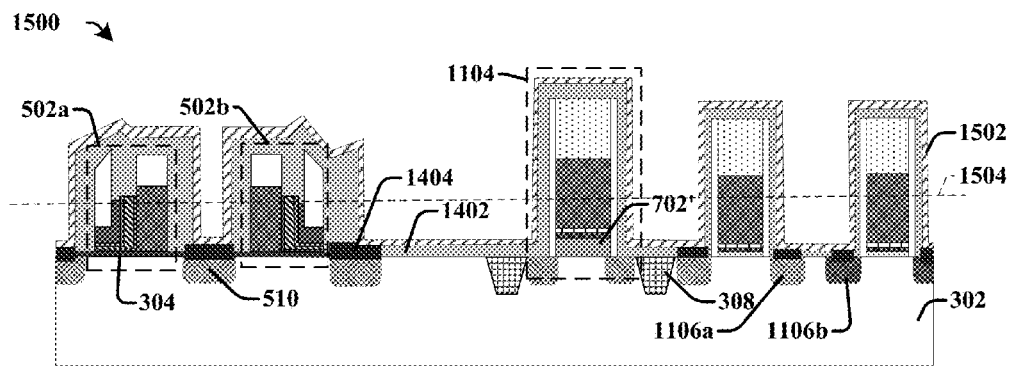

FIG. 15 illustrates a cross-sectional view of a semiconductor body 1500 after forming a CESL layer 1502 encapsulating the gate structures, the base salicide layer 1404 and the inter-gate oxide layer 1402. Reference numeral 1504 represents a horizontal plane till where a CMP (chemical mechanical polishing) process planarizes the integrated circuit in the following step.

Figure 16:
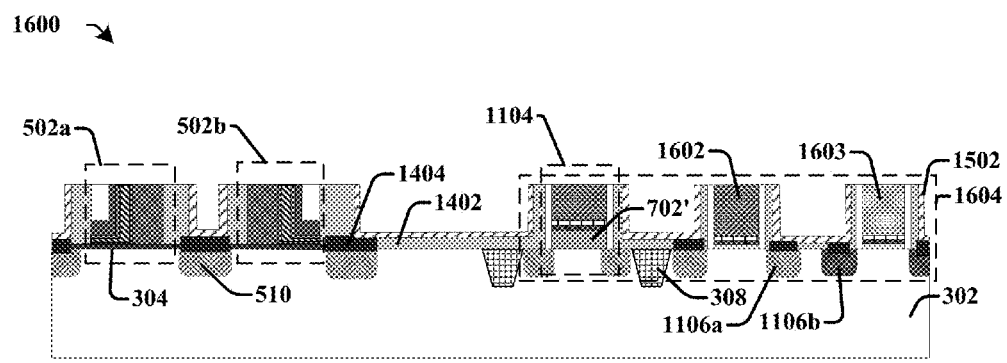

FIG. 16 illustrates a cross-sectional view of a semiconductor body 1600 after performing the CMP process on the semiconductor body 1500 till 1504 and performing a replacement gate (RPG) process. A replacement gate process is where the sacrificial poly gate 1002 is stripped away to form a recess (after source and drain regions have been formed), and a replacement metal gate 1602 is formed in the recess. Reference numeral 1602 represents an n-metal gate, making the corresponding transistor a HKMG NMOS transistor, while 1603 represents a p-metal gate, which makes the corresponding transistor a HKMG PMOS transistor. During the RPG process, a hard mask layer (not shown) covers the rest of the integrated circuit, during stripping/etching of the sacrificial poly 1002 as well as during deposition of the corresponding metal in the corresponding recesses. After the metals 1602 and 1603 are deposited, a second CMP process is performed and the hard mask layer removed. Now, 1604 represents a HKMG periphery circuit which includes a HKMG HV transistor 1104.

Figure 17:
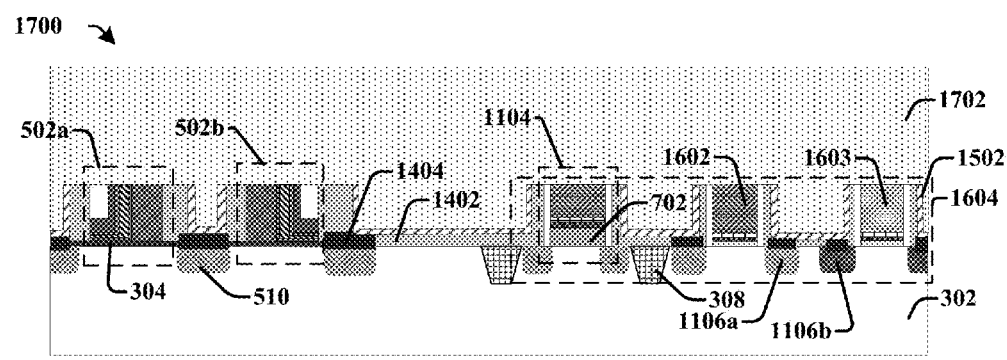

FIG. 17 illustrates a cross-sectional view of a semiconductor body 1700 after depositing an inter-layer dielectric (ILD) layer 1702 all over the semiconductor body 1600. In some embodiments, the ILD layer 1702 comprises SiN (silicon nitride).

Figure 18:
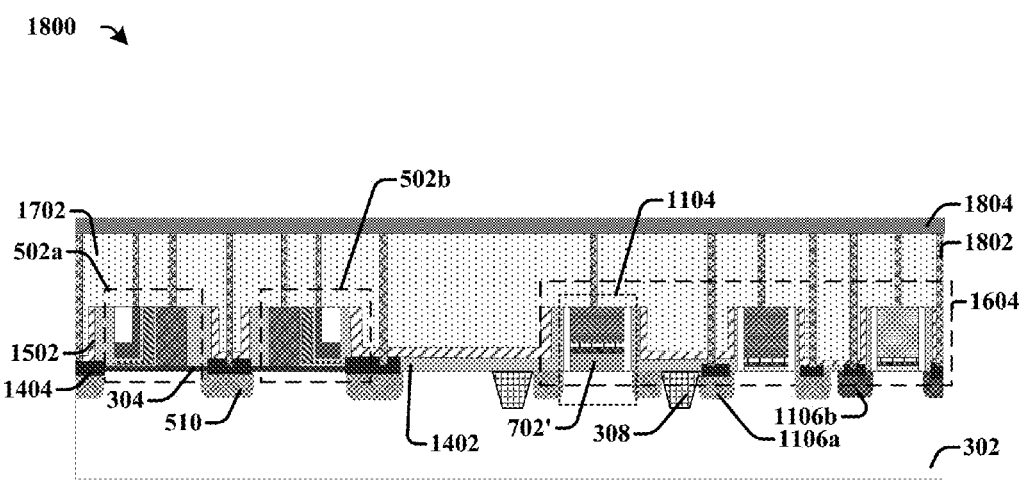

FIG. 18 illustrates a cross-sectional view of a semiconductor body 1800 after forming metal contacts 1802. Metal contacts 1802 extend downward to the base salicide layer 1404 and to the top surfaces of the gate structures, and can comprise Ti/TiN as a buffer layer which is filled with W in some embodiments. A protective barrier layer 1804 is also formed over the ILD layer 1702 and the metal contacts 1802. In some embodiments, the protective barrier layer comprises BPTEOS (borophosphorous tetraethylorthosilicate).

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method for integrating a HV HKMG transistor in an embedded flash memory-HKMG integrated circuit. A NVM device is formed over a memory region of a semiconductor substrate first, followed by formation of a HV gate insulating layer for the HV HKMG transistor at a specific location in a periphery region of the semiconductor substrate. Rest of the HV HKMG transistor is formed simultaneously during the formation of the HKMG periphery circuit. This method reduces divot issue in STI regions disposed in the boundary region of the semiconductor substrate (between memory region and periphery region) since a dielectric layer (first oxide) now protects the STI regions during the patterning of the HV gate insulating layer.

In some embodiments, the present disclosure relates to an integrated circuit (IC), comprising, an embedded memory region comprising an embedded non-volatile memory (NVM) device, and a periphery region comprising a high voltage high-κ metal gate (HV HKMG) transistor disposed over a high voltage (HV) gate insulating layer, and a periphery circuit disposed over a gate oxide layer.

In another embodiment, the present disclosure relates to an integrated circuit (IC) comprising, a semiconductor substrate including a periphery region and a memory cell region separated by a boundary region, a pair of split gate flash memory cells disposed on the memory cell region, a HKMG logic circuit disposed over a gate oxide layer on the periphery region, and a high voltage (HV) high-κ metal gate (HKMG) transistor disposed over a HV gate insulating layer on the periphery region at a position between the boundary region and the HKMG logic circuit.

In yet another embodiment, the present disclosure relates to a method of forming an integrated circuit (IC) comprising, providing a semiconductor substrate comprising a first region and a second region, forming a non-volatile memory (NVM) device over the first region, selectively forming a HV gate insulating layer over the semiconductor substrate in the second region, forming a HV HKMG transistor over the HV gate insulating layer, and forming one or more HKMG CMOS devices in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC) comprising:
   providing a semiconductor substrate comprising a first region and a second region;
   forming a non-volatile memory (NVM) device over the first region;
   forming a protective sacrificial layer that covers the NVM device while leaving the second region exposed;
   with the protective sacrificial layer in place over the NVM device, selectively forming a high voltage (HV) gate insulating layer over the semiconductor substrate in the second region;
   forming a gate oxide layer over the protective sacrificial layer and over the HV gate insulating layer;
   forming a HV high-κ metal gate (HKMG) transistor over the HV gate insulating layer; and
   forming one or more HKMG CMOS devices in the second region.

2. The method of claim 1, wherein forming the HV gate insulating layer comprises:
   forming a first oxide layer over the first and second regions;
   forming a high temperature oxide (HTO) layer over the first oxide layer; and patterning and etching the HTO layer to form the HV gate insulating layer.

3. The method of claim 2, wherein forming the HTO layer comprises rapid thermal annealing and etching the HTO layer comprises wet etching.

4. The method of claim 3, wherein:
a boundary region between the NVM device and the HV HKMG transistor in the semiconductor substrate, comprises a STI (shallow trench isolation) region;
the NVM device is formed over first region, prior to forming, patterning and etching the HTO layer; and
no wet etching occurs over the STI region in the boundary region.

5. The method of claim 1, wherein forming the one or more HKMG CMOS devices comprises:
depositing a high-κ dielectric layer over the first and second regions, wherein a bottom surface of the high-κ dielectric layer contacts an upper surface of the gate oxide layer;
depositing an etch stop layer over the high-κ dielectric layer;
depositing a sacrificial gate poly layer over the etch stop layer;
forming a hard mask layer over the sacrificial gate poly layer; and
patterning and etching the hard mask layer and the layers underneath to form gate stacks.

6. The method of claim 5, further comprising:
performing a first CMP on the hard mask layer to stop at a top surface of the sacrificial gate poly layer;
removing the sacrificial poly layer to form openings in the gate stacks;
depositing a metal gate electrode layer in the openings; and
performing a second CMP on the metal gate electrode layer.

7. The method of claim 6, wherein the metal gate electrode layer comprises Ti (titanium), TiN (titanium nitride), TiAl (titanium aluminum) or TaN (tantalum nitride).

8. The method of claim 5, wherein:
thickness of the HV gate insulating layer ranges between 80 Angstroms and 200 Angstroms;
thickness of the sacrificial gate poly layer is approximately 680 Angstroms; and thickness of the hard mask layer is approximately 1100 Angstroms.

9. A method of forming an integrated circuit (IC) comprising:
providing a semiconductor substrate comprising a memory region, a high-voltage transistor region, and a logic region;
forming a pair of split-gate flash memory cell structures over the memory region, wherein the pair of split-gate flash memory cell structures includes a pair of select gates spaced on opposite sides of a common source/drain region, and a pair of memory gates disposed about outer sidewalls of the pair of select gates, respectively;
forming a protective sacrificial layer that covers the pair of split-gate flash memory cell structures while leaving the high-voltage transistor region and logic region exposed;
with the protective sacrificial layer in place over the pair of split-gate flash memory cell structures, forming a high-voltage gate structure of a high-voltage transistor over the high-voltage transistor region and forming a logic gate structure over the logic transistor region;
after the high-voltage gate structure and logic gate structure have been formed, removing the protective sacrificial layer from over the split-gate flash memory cell; and
performing a chemical mechanical planarization (CMP) operation to planarize upper surfaces of the select gates with an upper surface of the high-voltage gate structure and upper surface of the logic gate structure.

10. The method of claim 9, further comprising:
after removing the protective sacrificial layer and prior to the CMP operation, forming a conformal layer over the split-gate flash memory cell structure.

11. The method of claim 9, wherein forming the high-voltage gate structure comprises:
forming a high temperature oxide (HTO) layer on the high-voltage transistor region of the semiconductor substrate;
forming a gate oxide layer over the HTO layer;
forming a high-k dielectric layer over the gate oxide layer;
forming an etch-stop layer over the high-k dielectric layer;
forming a polysilicon layer over the etch-stop layer; and
patterning the polysilicon layer, etch-stop layer, high-k dielectric layer, gate oxide layer, and HTO layer to form sidewalls that define the high-voltage gate structure.

12. The method of claim 11, further comprising:
performing a chemical mechanical planarization (CMP) operation to planarize upper surfaces of the select gates with an upper surface of the polysilicon layer and with an upper surface of the logic gate structure.

13. The method of claim 12, further comprising:
after the CMP operation has been performed, removing the polysilicon layer to form a recess in the high-voltage gate structure; and
depositing a replacement metal gate electrode layer in the recess.

14. The method of claim 9, wherein:
the high-voltage transistor includes a high-voltage gate insulating layer with a first thickness; and
the logic transistor includes a logic gate insulating layer with a second thickness that is less than the first thickness.

15. A method of forming an integrated circuit (IC) comprising:
providing a semiconductor substrate comprising a memory region, a high-voltage transistor region, and a logic region;
forming a non-volatile memory cell structure over the memory region;
forming a protective sacrificial layer that covers the non-volatile memory cell structure while leaving the high-voltage transistor region and logic region exposed;
with the protective sacrificial layer in place over the non-volatile memory cell structure, forming a first oxide layer over the protective sacrificial layer, the high-voltage transistor region, and the logic region;
with the protective sacrificial layer in place over the non-volatile memory cell structure, forming a high-voltage gate structure of a high-voltage transistor over the high-voltage transistor region and forming a logic gate structure over the logic transistor region; and
after the high-voltage gate structure and logic gate structure have been formed, removing the protective sacrificial layer from over the non-volatile memory cell structure.

16. The method of claim 15, further comprising:
after removing the protective sacrificial layer, forming a conformal layer over the non-volatile memory cell structure.

17. The method of claim 16, wherein the non-volatile memory cell includes a pair of split-gate flash memory cells disposed on the memory region.

18. The method of claim 17, wherein each split-gate flash memory cell comprises:
a select gate (SG) arranged between first and second source/drain regions;
a memory gate (MG) arranged alongside the select gate between the first and second source/drain regions; and
a charge-trapping layer arranged between neighboring sidewalls of the MG and the SG, wherein the charge-trapping layer extends under the MG.

19. The method of claim 18, further comprising:
after the conformal layer has been formed, performing a chemical mechanical planarization (CMP) operation to planarize upper surfaces of the SG with an upper surface of the high-voltage gate structure and an upper surface of the logic gate structure.

20. The method of claim 15, further comprising:
with the protective sacrificial layer in place over the non-volatile memory cell structure, forming a second oxide layer over the first oxide layer, wherein a bottom surface of the second oxide layer contacts an upper surface of the first oxide layer.

* * * * *